US010861639B2

(12) United States Patent
Li et al.

(10) Patent No.: US 10,861,639 B2
(45) Date of Patent: Dec. 8, 2020

(54) ADAPTIVE CONTROL LOOP GAIN FOR SWITCHING MODE POWER SUPPLY

(71) Applicant: Infineon Technologies Austria AG, Villach (AT)

(72) Inventors: Dong Li, Singapore (SG); Nitin Agarwal, Meerut (IN); Po-Jung Chung, New Taipei (TW)

(73) Assignee: Infineon Technologies Austria AG, Villach (AT)

( * ) Notice: Subject to any disclaimer, the term of this patent is extended or adjusted under 35 U.S.C. 154(b) by 269 days.

(21) Appl. No.: 16/132,985

(22) Filed: Sep. 17, 2018

(65) Prior Publication Data
US 2020/0090859 A1   Mar. 19, 2020

(51) Int. Cl.
| H02M 1/08 | (2006.01) |
| H02M 1/32 | (2007.01) |
| H02M 1/36 | (2007.01) |
| H02M 3/335 | (2006.01) |
| H01F 27/29 | (2006.01) |
| H03B 7/14 | (2006.01) |

(52) U.S. Cl.
CPC ............ H01F 27/29 (2013.01); H03B 7/143 (2013.01)

(58) Field of Classification Search
None
See application file for complete search history.

(56) References Cited

U.S. PATENT DOCUMENTS

| 8,098,501 | B2 * | 1/2012 | Sonobe .................. H02M 1/36 363/21.01 |
| 8,724,346 | B2 * | 5/2014 | Nate .................. H02M 3/33507 363/21.01 |
| 9,209,699 | B1 * | 12/2015 | Wu ......................... H02M 1/44 |
| 9,673,727 | B2 * | 6/2017 | Nishijima ............... H02M 1/44 |
| 10,153,702 | B2 * | 12/2018 | Teo ......................... H02M 1/08 |
| 10,326,371 | B2 * | 6/2019 | Chung ............. H02M 3/33515 |
| 10,411,606 | B2 * | 9/2019 | Oshima ................. H02M 1/36 |
| 10,432,084 | B2 * | 10/2019 | Saito ..................... H02M 1/36 |

(Continued)

OTHER PUBLICATIONS

"IDP2321 Digital Multi-Mode PFC + LLC Combo Controller," Infineon, Rev. V1.0, Oct. 27, 2016, 42 pp.

(Continued)

Primary Examiner — Kenneth B Wells
(74) Attorney, Agent, or Firm — Shumaker & Sieffert, P.A.

(57) ABSTRACT

A device for controlling a switching mode power supply includes a regulation module, a feedback node, and a resistance module. The regulation module is adapted to cause a switching module to selectively couple, based on an oscillation frequency, a primary side winding of a transformer and a supply to control a voltage, current, or power output at a secondary side winding of the transformer. The feedback node is adapted to receive an indication of a voltage at the secondary side winding of the transformer. The resistance module is adapted to selectively set a pull-up resistance based on a comparison between a time-controlled frequency and a voltage-controlled frequency that is generated based on a voltage at the feedback node, wherein the regulation module is adapted to set the oscillation frequency as the time-controlled frequency or the voltage-controlled frequency.

20 Claims, 8 Drawing Sheets

(56) References Cited

U.S. PATENT DOCUMENTS 10,547,235 B2 * 1/2020 Shimura ................. H02M 1/08
10,715,049 B2 * 7/2020 Asano ................... H02M 3/337

OTHER PUBLICATIONS

"IDP2322 Digital Multi-Mode PFC + LLC Combo Controller," Infineon, Rev. V1.0, Sep. 4, 2017, 46 pp.
"Digital Multi-Mode PFC + LLC Combo Controller," IDP2303 Data Sheet, Infineon, Rev. V2.0, Mar. 21, 2017, 38 pp.
Texas Instruments, TL43xx Precision Programmable Reference, SLVS543O, Aug. 2004, revised Jan. 2015, 82 pp.

* cited by examiner

ADAPTIVE CONTROL LOOP GAIN FOR SWITCHING MODE POWER SUPPLY

TECHNICAL FIELD

This disclosure relates to circuitry for controlling a loop gain and, more particularly, circuitry for controlling a loop gain for switching power mode supplies.

BACKGROUND

In isolated direct current to direct current (DC-DC) converters using a switching mode power supply, a controller on a primary side receives a feedback signal representing an output voltage on a secondary side. The controller increases the output voltage using a loop gain when the feedback signal indicates the output voltage is less than a desired voltage and decreases the output voltage using the loop gain when the feedback signal indicates the output voltage is greater than the desired voltage.

SUMMARY

In general, this disclosure is directed to a circuit configured with an adapted loop gain that helps to prevent overshoot during start-up. For example, a controller for a switching mode power supply may set an oscillation frequency based on a pull-up resistance. In this example, the pull-up resistance is selectively set based on a comparison between a time-controlled frequency and a voltage-controlled frequency. In this way, the controller may use the pull-up resistance to determine a loop gain that helps to prevent overshoot during start-up.

In an example, a device for controlling a switching mode power supply includes a regulation module adapted to cause a switching module to selectively couple, based on an oscillation frequency, a primary side winding of a transformer and a supply to control a voltage, current, or power output at a secondary side winding of the transformer, a feedback node adapted to receive an indication of a voltage at the secondary side winding of the transformer, and a resistance module adapted to selectively set a pull-up resistance between the feedback node and a pull-up voltage supply based on a comparison between a time-controlled frequency and a voltage-controlled frequency that is generated based on a voltage at the feedback node, wherein the regulation module is adapted to set the oscillation frequency as the time-controlled frequency or the voltage-controlled frequency.

In another example, a method for controlling a switching mode power supply includes causing, by processing circuitry, a switching module to selectively couple, based on an oscillation frequency, a primary side winding of a transformer and a supply to control a voltage, current, or power output at a secondary side winding of the transformer, receiving, by the processing circuitry, at a feedback node, an indication of a voltage at the secondary side winding of the transformer, and selectively setting, by the processing circuitry, a pull-up resistance between the feedback node and a pull-up voltage supply based on a comparison between a time-controlled frequency and a voltage-controlled frequency that is generated based on a voltage at the feedback node, wherein causing the switching module to selectively couple the primary side winding comprises setting the oscillation frequency as the time-controlled frequency or the voltage-controlled frequency.

In another example, a system for controlling a switching mode power supply includes a supply, a switching module, a transformer comprising at least a primary side winding and a secondary side winding, a regulation module adapted to cause the switching module to selectively couple, based on an oscillation frequency, the primary side winding and the supply to control a voltage, current, or power output at the secondary side winding, a feedback node adapted to receive an indication of a voltage at the secondary side winding, and a resistance module adapted to selectively set a pull-up resistance between the feedback node and a pull-up voltage supply based on a comparison between a time-controlled frequency and a voltage-controlled frequency that is generated based on a voltage at the feedback node, wherein the regulation module is adapted to set the oscillation frequency as the time-controlled frequency or the voltage-controlled frequency.

Details of these and other examples are set forth in the accompanying drawings and the description below. Other features, objects, and advantages will be apparent from the description and drawings, and from the claims.

DETAILED DESCRIPTION

Figure 1:
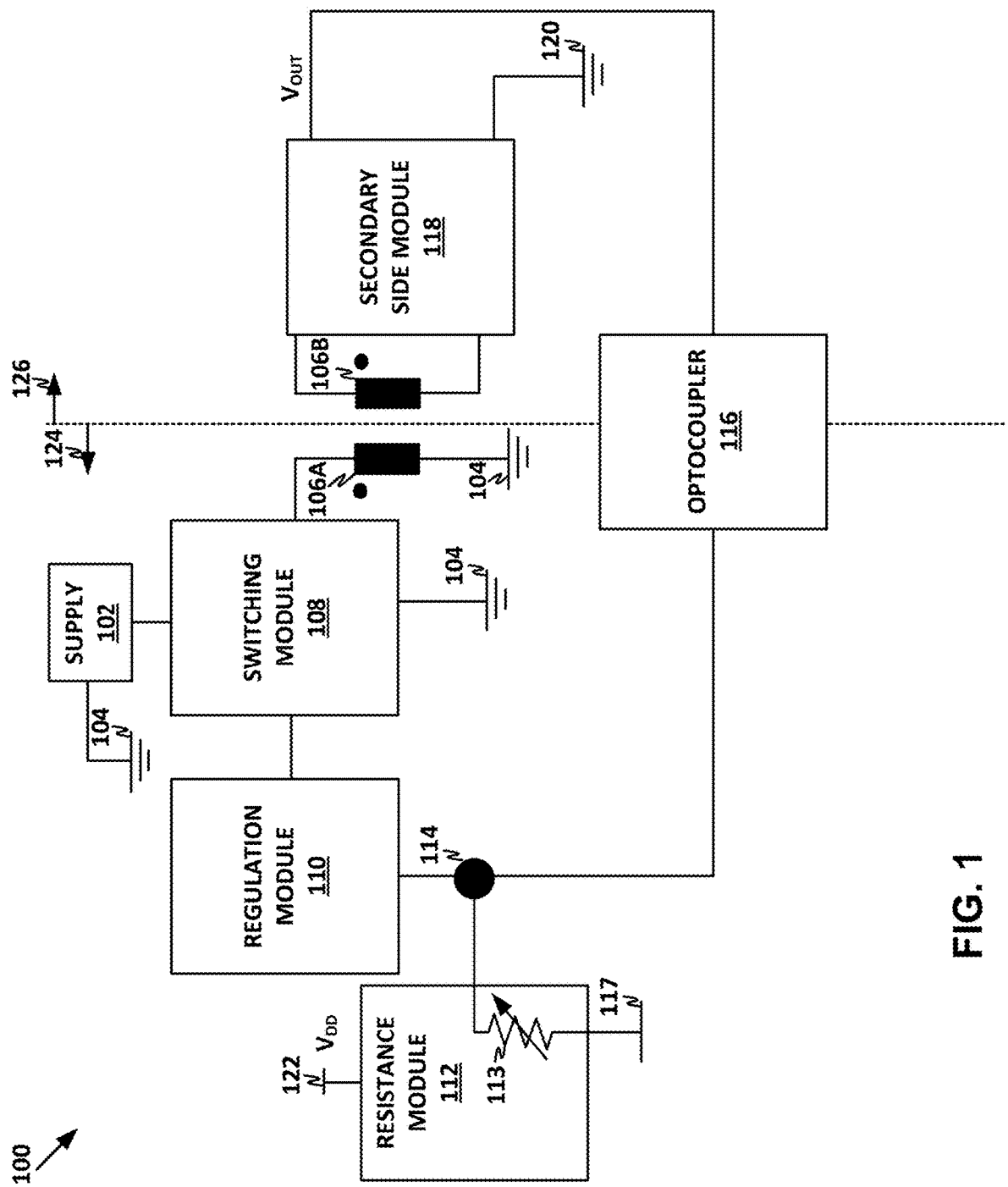
FIG. 1 is a block diagram illustrating a system adapted to selectively set a pull-up resistance in accordance with one or more techniques of this disclosure.

In some isolated direct current to direct current (DC-DC) converters for a switching mode power supply, a controller is located in a primary side for sensing analog input and driving switchers while loop compensation is located on a secondary side for regulating output voltage. A cost-effective implementation of secondary compensation may include using resistor-capacitor (RC) networks and a shunt regulator. The output of the shunt regulator is transferred to primary controller as feedback signal via an opto-coupler.

During a start-up stage, the shunt regulator compensation loop may be out of control due to the output voltage being less than a rated target voltage. Therefore, the output voltage may have an overshoot that may exceed a specified maximum output voltage. In some examples, this disclosure describes techniques for minimizing the output overshoot during start-up.

Some systems may arrange a controller in the secondary side and sense the output voltage directly. However, arranging the controller on the secondary side may increase bill of material (BOM) cost because additional circuits are used to sense a primary signal, drive primary switches, and supply the integrated circuit voltage $V_{cc}$.

Some systems may sense the output voltage in the primary side via transformer windings. However, sensing the output voltage via transformer windings may be inaccurate voltage due to transformer winding's coupling and cross regulation issues.

Some systems may modify shunt regulator compensation RC networks, e.g. add delay circuits of shunt regulator output pin or Type III compensator. However, modifying shunt regulator compensation RC networks may increase loop design complexity and may not solve overshoot under conditions. Examples of when output overshoot occurs includes when the alternating current (AC) input is switched on and off frequently at extremely light load condition. For example, during an AC OFF stage, the output voltage decays very slowly at light load and the shunt regulator RC networks stays at deep saturation as long as $V_{out}$ is still able to supply shunt regulator in operation. Simultaneously, the AC input is switched on again and integrated circuit begins switching from soft-start time-controlled oscillation (TCO). The feedback loop voltage-controlled oscillation (VCO) will take over soft-start only after exiting deep saturation by negative error signal from output overshoot. In this example, increasing a pull-up resistance (RPU) at the feedback node (e.g., pin) may result in lower output voltage overshoot.

Accordingly, in order to minimize output overshoot occurring when the AC input is switched on and off frequently at extremely light load condition, systems described herein may increase control loop DC gain during start-up. Because control loop stability relies on loop gain as well, such systems may reduce the DC gain in steady state. DC gain may be proportional to the resistance ratio between the opto-coupler's input and output pull-up resistors. Accordingly, systems described herein may use an internal pull-up resistance at a feedback node connecting to an opto-coupler output and use firmware to set the internal pull-up resistance to a relatively large value during soft-start and set the internal pull-up resistance to a relatively small value during steady state, which may reduce overshoot and maintain loop stability.

For example, a system may change a feedback node internal resistance adaptively under different operating conditions. More specifically, the system may set a pull-up resistance to a first resistance value for start-up and set the pull-up resistance to one or more other resistance values after start-up. In this way, the system may minimize the output overshoot during start-up.

Circuits configured to adaptively set a pull-up resistance may help to eliminate complex fine-tuning on shunt regulator compensation RC networks and helping to satisfy overshoot requirement under all test conditions without compromising other performance parameters of a system implementing selectively setting the pull-up resistance. Another advantage of such circuits may be a lower BOM cost compared to systems that omit adaptively setting a pull-up resistance.

FIG. 1 is a block diagram illustrating a system adapted to selectively set a pull-up resistance in accordance with one or more techniques of this disclosure. FIG. 1 shows system 100 which includes supply 102, primary side winding 106A and secondary side winding 106B (collectively, transformer 106), switching module 108, regulation module 110, resistance module 112, optocoupler 116, pull-up voltage supply 117, and secondary side module 118. System 100 may include additional components than those shown.

Supply 102 may be configured to provide electrical power to one or more other components of system 100. For instance, supply 102 may be configured to supply an input power to primary side winding 106A. In some examples, supply 102 may be an output of a power converter or power inverter. For instance, supply 102 may comprise an output of a direct current (DC) to DC power converter, an AC to DC power converter, a DC to AC power inverter, and the like. In some examples, supply 102 may represent a connection to an electrical supply grid. In some examples, the input power signal provided by supply 102 may be a DC input power signal. For instance, supply 102 may be configured to provide a DC input power signal in the range of −5 VDC to −40 VDC. In some examples, supply 102 may be a battery which may be configured to store electrical energy. Examples of batteries may include, but are not limited to, nickel-cadmium, lead-acid, nickel-metal hydride, nickel-zinc, silver-oxide, lithium-ion, lithium polymer, any other type of rechargeable battery, or any combination of such batteries.

Switching module 108 may be configured to selectively establish a channel that electrically connects supply 102 and primary side winding 106A. Switching module 108 may include one or more switching elements. Examples of switching elements may include, but are not limited to, silicon-controlled rectifier (SCR), a Field Effect Transistor (FET), and bipolar junction transistor (BJT). Examples of FETs may include, but are not limited to, junction field-effect transistor (JFET), metal-oxide-semiconductor FET (MOSFET), dual-gate MOSFET, insulated-gate bipolar transistor (IGBT), any other type of FET, or any combination of the same. Examples of MOSFETS may include, but are not limited to, PMOS, NMOS, DMOS, or any other type of MOSFET, or any combination of the same. Examples of BJTs may include, but are not limited to, PNP, NPN, heterojunction, or any other type of BJT, or any combination of the same. It should be understood that a switching element may be a high side switch or low side switch. For example, switching module 108 may include a high side switching element and a low side switching element. Additionally, a switching element may be voltage-controlled and/or current-controlled. Examples of current-controlled switching elements may include, but are not limited to, gallium nitride (GaN) MOSFETs, BJTs, or other current-controlled elements.

For example, a high side switching element of switching module 108 may be switched in (e.g., activated) such that current output from supply 102 flows through primary side winding 106A to reference node 104 (e.g., a ground of supply 102). In some examples, a low side switching element of switching module 108 may be switched in (e.g., activated) to couple primary side winding 106A to reference node 104.

Optocoupler 116 may be configured to transfer electrical signals between primary side 124 and secondary side 126 using light to generate an indication of a voltage at secondary side winding 106B at feedback node 114. Primary side 124 may be electronically isolated from secondary side 126. For example, reference node 120 of secondary side module 118 may be different from reference node 104 of supply 102. Although the example of FIG. 1 illustrates using light to transfer electrical signals between primary side 124 and secondary side 126, some examples may use other techniques, such as, but not limited to, a magnetic flux, hall effect, magnetoresistance, or another technique to transfer electrical signals.

Regulation module 110 may be configured to drive switching module 108 to provide input power to primary side winding 106A for generating a target voltage, current, or power at secondary side winding 106B. For example, regulation module 110 may increase an oscillation frequency to increase the target voltage, current, or power at secondary side winding 106B. Regulation module 110 may decrease the oscillation frequency to decrease the target voltage, current, or power at secondary side winding 106B. As used herein, oscillation frequency may refer to a rate regulation module 110 cycles between a signal for turning on switching module 108 and a signal for turning off switching module 108. Regulation module 110 may set the oscillation frequency as a time-controlled frequency. As used herein, a time-controlled frequency may refer to a predetermined ordered list of (decreasing) frequencies. Regulation module 110 may set the oscillation frequency as a voltage-controlled frequency. As used herein, a voltage-controlled frequency may refer to a frequency generated based a voltage at feedback node 114.

In some examples, regulation module 110 may comprise an analog circuit. In other examples, regulation module 110 may comprise a microcontroller on a single integrated circuit containing a processor core, memory, inputs, and outputs. For example, regulation module 110 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. In some examples, regulation module 110 may be a combination of one or more analog components and one or more digital components.

Secondary side module 118 may be configured to provide power from secondary side winding 106B and to prevent power from being supplied to secondary side winding 106B. Secondary side module 118 may include one or more diodes, one or more synchronous rectifiers, an RC network, a shunt regulator, and/or other electrical components.

Resistance module 122 may be configured to adaptively set a resistance of pull-up resistance 113 under different operating conditions of regulation module 110. For example, resistance module 122 may set pull-up resistance 113 to a first resistance value for start-up and set pull-up resistance 113 to one or more other resistance values after start-up. Pull-up resistance 113 may be any suitable component that changes resistance, for example, but not limited to, a series of switches arranged in parallel with respective resistors (e.g., see FIG. 7), a switching element, a Rheostat, or another pull-up resistance. Resistance module 122 may comprise an analog circuit. In some examples, resistance module 122 may be a microcontroller on a single integrated circuit containing a processor core, memory, inputs, and outputs. For example, resistance module 122 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. In some examples, resistance module 122 may be a combination of one or more analog components and one or more digital components.

Pull-up voltage supply 117 may be configured to provide a regulated voltage to pull-up resistance 113. Pull-up voltage supply 117 may be an output of a power converter or power inverter. For instance, pull-up voltage supply 117 may be an output of a DC to DC power converter, an AC to DC power converter, a DC to AC power inverter, and the like.

In accordance with one or more techniques described herein, regulation module 110 may cause switching module 108 to selectively couple, based on an oscillation frequency, primary side winding 106A of transformer 106 and supply 102 to control a voltage, current, or power output at secondary side winding 106B of transformer 106. Regulation module 110 receives, at feedback node 114, an indication of a voltage at secondary side winding 106B of transformer 106. Resistance module 112 selectively sets pull-up resistance 113 between feedback node 114 and pull-up voltage supply 117 based on a comparison between a time-controlled frequency and a voltage-controlled frequency. In some examples, the voltage-controlled frequency is generated based on a voltage at feedback node 114. In this example, causing switching module 108 to selectively couple primary side winding 106A comprises setting the oscillation frequency as the time-controlled frequency or the voltage-controlled frequency. In this way, system 100 may minimize the output overshoot during start-up.

Figure 2:
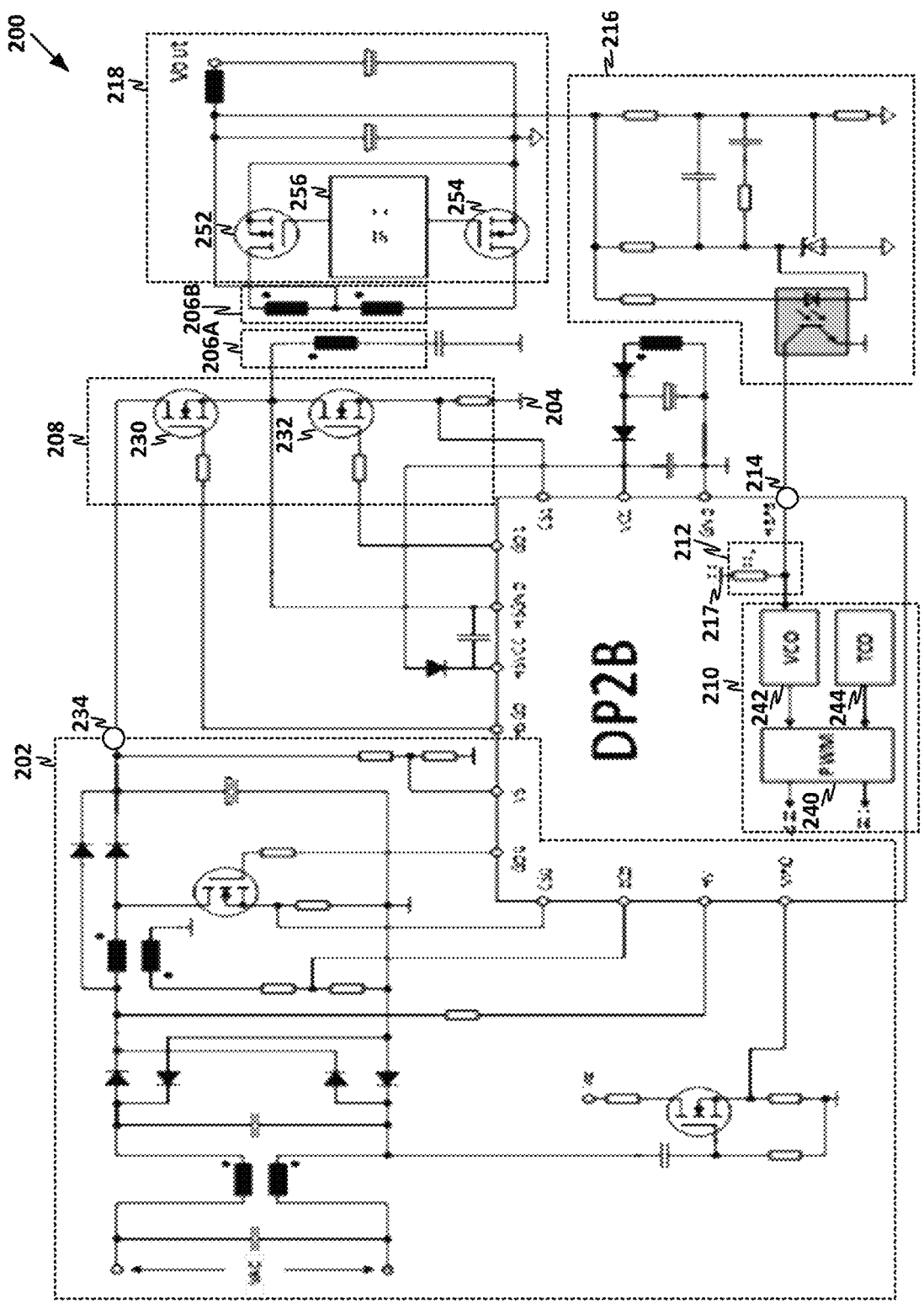
FIG. 2 is a circuit diagram illustrating a circuit adapted to selectively set a pull-up resistance in accordance with one or more techniques of this disclosure.

FIG. 2 is a circuit diagram illustrating a circuit 200 adapted to selectively set a pull-up resistance in accordance with one or more techniques of this disclosure. As shown, circuit 200 includes supply 202, primary side winding 206A and secondary side winding 206B (collectively, transformer 206), switching module 208, regulation module 210, resistance module 212, optocoupler 216, pull-up voltage supply 217, and secondary side module 218, which maybe examples of supply 102, primary side winding 106A and secondary side winding 106B (collectively, transformer 106), switching module 108, regulation module 110, resistance module 112, optocoupler 116, pull-up voltage supply 117, and secondary side module 118 of FIG. 1, respectively. Circuit 200 may include additional components than those shown.

In the example of FIG. 2, switching module 208 includes high side switching element 230 including a first node coupled to positive terminal 234 of supply 202, a second node coupled to primary side winding 206A of transformer 206, and a control node. In this example, switching module 208 includes low side switching element 232 including a first node coupled to primary side winding 206A of transformer 206, a second node coupled to negative terminal 204 of supply 202, and a control node. As shown, the control node of high side switching element 230 is coupled to a high side gate driver (HSGD) pin for regulation module 210 and the control node of low side switching element 232 is coupled to a gate driver (GD1) pin for regulation module 210.

Regulation module 210 includes switch driving circuitry 240 (also referred to herein as pulse width modulation module or simply "PWM"), voltage-controlled oscillator (VCO) 242, time-controlled oscillator (TCO) 244. VCO 242 is adapted to generate a voltage-controlled frequency based on a voltage at feedback node 214. For instance, VCO 242 is adapted to generate a voltage-controlled frequency based the indication of the voltage at secondary side winding 206B output by optocoupler 216 to feedback node 214. More specifically, for example, VCO 242 may be adapted to increase a voltage-controlled frequency when the voltage at secondary side winding 206B output by optocoupler 216 to feedback node 214 is less than a threshold and to decrease the voltage-controlled frequency when the voltage at secondary side winding 206B output by optocoupler 216 to feedback node 214 is not less than the threshold.

TCO 244 may be adapted to generate a time-controlled frequency according to one or more predetermined ordered lists of frequencies. In some examples, TCO 244 may be adapted to generate a time-controlled frequency according to a predetermined ordered list of decreasing frequencies. In some examples, TCO 244 may be adapted to generate a time-controlled frequency according to a predetermined ordered list of increasing frequencies. Regulation module 210 may set the oscillation frequency as the voltage-controlled frequency or the time-controlled frequency.

Switch driving circuitry 240 is adapted to selectively generate, based on the oscillation frequency, a first control signal at the control node of high side switching element 230 to cause high side switching element 230 to establish a first channel between the first node of high side switching element 230 and the second node of high side switching element 230 to couple 234 positive terminal of supply 202 to primary side winding 206A of transformer 206. In this example, switch driving circuitry 240 is adapted to selectively generate, based on the oscillation frequency, a second control signal at the control node of low side switching element 232 to cause low side switching element 232 to establish a second channel between the first node of low side switching element 232 and the second node of low side switching element 232 to couple negative terminal 204 of supply 202 to primary side winding 206A of transformer 206.

For example, during a first portion of a switching signal, switch driving circuitry 240 may be adapted to generate, based on the oscillation frequency, a first control signal at the control node of high side switching element 230 to cause high side switching element 230 to switch in such that high side switching element 230 establishes a first channel between the first node of high side switching element 230 and the second node of high side switching element 230 to couple 234 positive terminal of supply 202 to primary side winding 206A of transformer 206. In some examples, during the first portion of a switching signal, switch driving circuitry 240 is adapted to generate, based on the oscillation frequency, a second control signal at the control node of low side switching element 232 to switch out low side switching element 232 to refrain from establishing a second channel between the first node of low side switching element 232 and the second node of low side switching element 232.

In some examples, during a second portion of a switching signal, switch driving circuitry 240 may be adapted to generate, based on the oscillation frequency, a first control signal at the control node of high side switching element 230 to cause high side switching element 230 to switch out such that high side switching element 230 refrains from establishing a first channel between the first node of high side switching element 230 and the second node of high side switching element 230. In some examples, during the second portion of a switching signal, switch driving circuitry 240 is adapted to generate, based on the oscillation frequency, a second control signal at the control node of low side switching element 232 to switch in low side switching element 232 to establish a second channel between the first node of low side switching element 232 and the second node of low side switching element 232 to couple negative terminal 204 of supply 202 to primary side winding 206A of transformer 206.

Switch driving circuitry 240 may be adapted for dead-time switching. For example, switch driving circuitry 240 may be adapted to generate, during a dead-time portion of a switching signal, the first control signal at a control node of high side switching element 230 to switch out high side switching element 230 such that high side switching element 230 refrains from establishing a first channel between the first node of high side switching element 230 and the second node of high side switching element 230. In this example, switch driving circuitry 240 may be adapted to generate, during the dead-time portion of a switching signal, a second control signal at the control node of low side switching element 232 to switch out low side switching element 232 such that low side switching element 232 refrains from establishing a second channel between a first node of low side switching element 232 and a second node of low side switching element 232.

Secondary side module 218 may include switching element 252, switching element 254, and synchronous rectification (SR) controller 256 (also referred to herein as SR integrated circuit 256 or simply "SR IC 256"). SR controller 256 may selectively switch switching element 252 and switching element 254 to permit current to flow from secondary side winding 206B to an output of secondary side module 218 and to prevent current from flowing from the output of secondary side module 218 to secondary side winding 206B. SR controller 256 may include an analog circuit. In some examples, SR controller 256 may be a microcontroller on a single integrated circuit containing a processor core, memory, inputs, and outputs. For example, SR controller 256 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. In some examples, SR controller 256 may be a combination of one or more analog components and one or more digital components.

Figure 3:
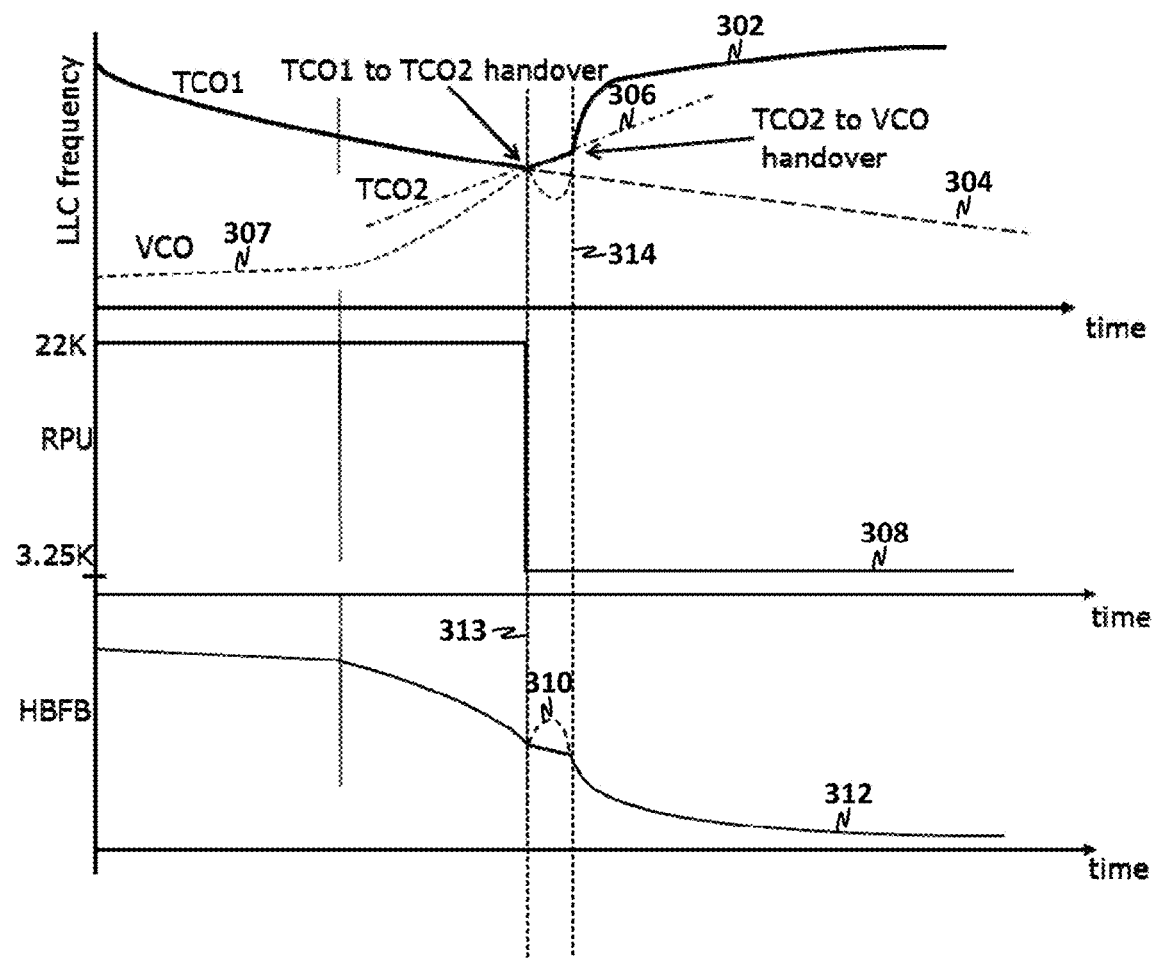
FIG. 3 is a graph illustration of selectively setting a pull-up resistance to a selected resistance value of two resistance values in accordance with one or more techniques of this disclosure.

FIG. 3 is a graph illustration of selectively setting a pull-up resistance to a selected resistance value of two resistance values in accordance with one or more techniques of this disclosure. The abscissa axis (e.g., horizontal) of FIG. 3 represents time and the ordinate axis (e.g., vertical) of FIG. 3 represents oscillation frequency 302, resistance 308 of pull-up resistance 113, and voltage 312 at feedback node 114.

In the example of FIG. 3, resistance module 112 may be adapted to set pull-up resistance 113 to a first resistance value (e.g., 22 kilo-ohms) until a voltage-controlled frequency (e.g., voltage-controlled frequency 307) is greater than a time-controlled frequency (e.g., first time-controlled frequency 304, also referred to herein as first TRO curve 304 or simply TCO1 304). In this example, resistance module 112 may be adapted to set the pull-up resistance to a second resistance value (e.g., 3.25 kilo-ohms) that is less than the first resistance value after the voltage-controlled frequency has been greater than a time-controlled frequency. For instance, as shown at time 313, resistance module 112 may change resistance 308 from a soft-start resistance value (e.g., 22 kilo-ohms) to a steady state resistance value (e.g., 3.25 kilo-ohms) in one step after soft-start TCO to VCO. A side effect of a using two resistance values is an abrupt frequency decrement that may result in overshoot 310 due to an abrupt increment of feedback voltage.

In accordance with one or more techniques described herein, regulation module 110 may generate the time-controlled frequency using an ordered list of decreasing frequencies (e.g., TCO1 304) until voltage-controlled frequency 307 is greater than the time-controlled frequency. In this example, regulation module 110 may be adapted to generate second TCO curve (TCO2) 306 using an ordered list of increasing frequencies after voltage-controlled frequency 307 has been greater than the time-controlled frequency.

More specifically, for example, regulation module 110 may be adapted to set oscillation frequency 302 as TCO1 304 and TCO2 306 until the time-controlled oscillation module outputs the time-controlled frequency using the ordered list of increasing frequencies and the voltage-controlled frequency is greater than the time-controlled frequency. For instance, regulation module 110 may be adapted to set oscillation frequency 302 as TCO1 304 before time 313 (e.g., when voltage-controlled frequency 307 is greater than TCO1 304) and set oscillation frequency 302 as TCO2 306 after time 313. In this instance, regulation module 110 may continue to set oscillation frequency 302 as TCO2 306 until voltage-controlled frequency 307 is greater than TCO2 306. In this example, regulation module 110 may be adapted to set the oscillation frequency as the voltage-controlled frequency after the time-controlled oscillation module outputs the time-controlled frequency using the ordered list of increasing frequencies and after the voltage-controlled frequency has been greater than the time-controlled frequency.

Accordingly, in some examples, regulation module 110 may use TCO2 306 and handover from TCO1 304 to TCO2 306 when resistance module 112 changes resistance 308 from the soft-start resistance value (e.g., 22 kilo-ohms) to the steady state resistance value (e.g., 3.25 kilo-ohms). In this example, TCO2 306 is sweeping up (e.g., increasing) switching frequency until TCO2 306 corresponds to (e.g., equals) the VCO frequency. In the example of FIG. 3, regulation module 110 may transition from setting the oscillation frequency as second TCO 306 to setting the oscillation frequency as VCO at time 314. In this way, regulation module 110 may help to prevent the abrupt feedback voltage change from impacting switching frequency and may limit output overshoot.

Figure 4:
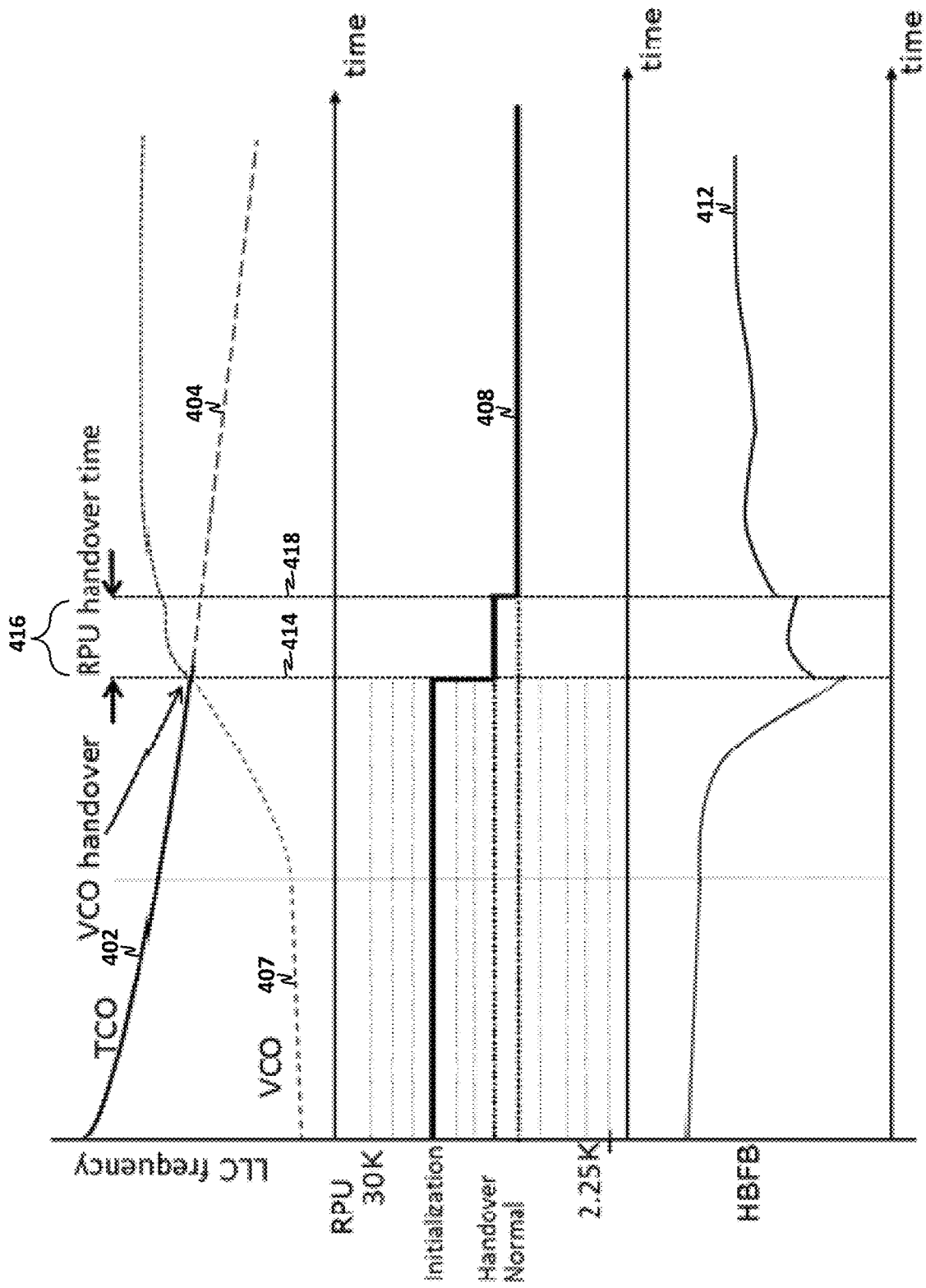
FIG. 4 is a graph illustration of selectively setting a pull-up resistance to a selected resistance value of three resistance values in accordance with one or more techniques of this disclosure.

FIG. 4 is a graph illustration of selectively setting a pull-up resistance to a selected resistance value of three resistance values in accordance with one or more techniques of this disclosure. The abscissa axis (e.g., horizontal) of FIG. 4 represents time and the ordinate axis (e.g., vertical) of FIG. 4 represents oscillation frequency 402, resistance 408 of pull-up resistance 113, and voltage 412 at feedback node 114.

In the example of FIG. 4, resistance module 112 may be adapted to set the oscillation frequency 402 as the time-controlled frequency 404 until voltage-controlled frequency 407 is greater than time-controlled frequency 404 and set oscillation frequency 402 as voltage-controlled frequency 407 after voltage-controlled frequency 407 has been greater than time-controlled frequency 404.

In the example of FIG. 4, resistance module 112 may be adapted to set pull-up resistance 113 to a first resistance value until voltage-controlled frequency 407 is greater than time-controlled frequency 404. In this example, resistance module 112 may be adapted to set pull-up resistance 113 to a second resistance value that is less than the first resistance value after voltage-controlled frequency 407 has been greater than time-controlled frequency 404.

For example, resistance module 112 may be configured to set pull-up resistance 113 to an initial pull-up resistance value to use before system handover to VCO. For example, resistance module 112 may set pull-up resistance 113 to a value of between 30 kilo-ohms to 2.25 kilo-ohms before system handover to VCO at time 414. In some examples, resistance module 112 may be configured to set pull-up resistance 113 to one or more handover pull-up resistance values to use during system handover to VCO at time range 416. For example, resistance module 112 may set pull-up resistance 113 to a value of between 30 kilo-ohms to 2.25 kilo-ohms during system handover to VCO. In some instances, each resistance value of the one or more handover pull-up resistance values is less than the initial pull-up resistance value.

Resistance module 112 may be configured to set pull-up resistance handover time specifying a duration of the system handover to VCO. For example, resistance module 112 may set the pull-up resistance handover time to correspond to 0 to 2.097152 seconds. Resistance module 112 may be configured to set pull-up resistance 113 to a steady state pull-up resistance value to use after system handover to VCO at time 418. For example, resistance module 112 may set pull-up resistance 113 to a value of between 30 kilo-ohms to 2.25 kilo-ohms after system handover to VCO. In some instances, each resistance value of the one or more handover pull-up resistance values is greater than the steady-state pull-up resistance value.

Figure 5:
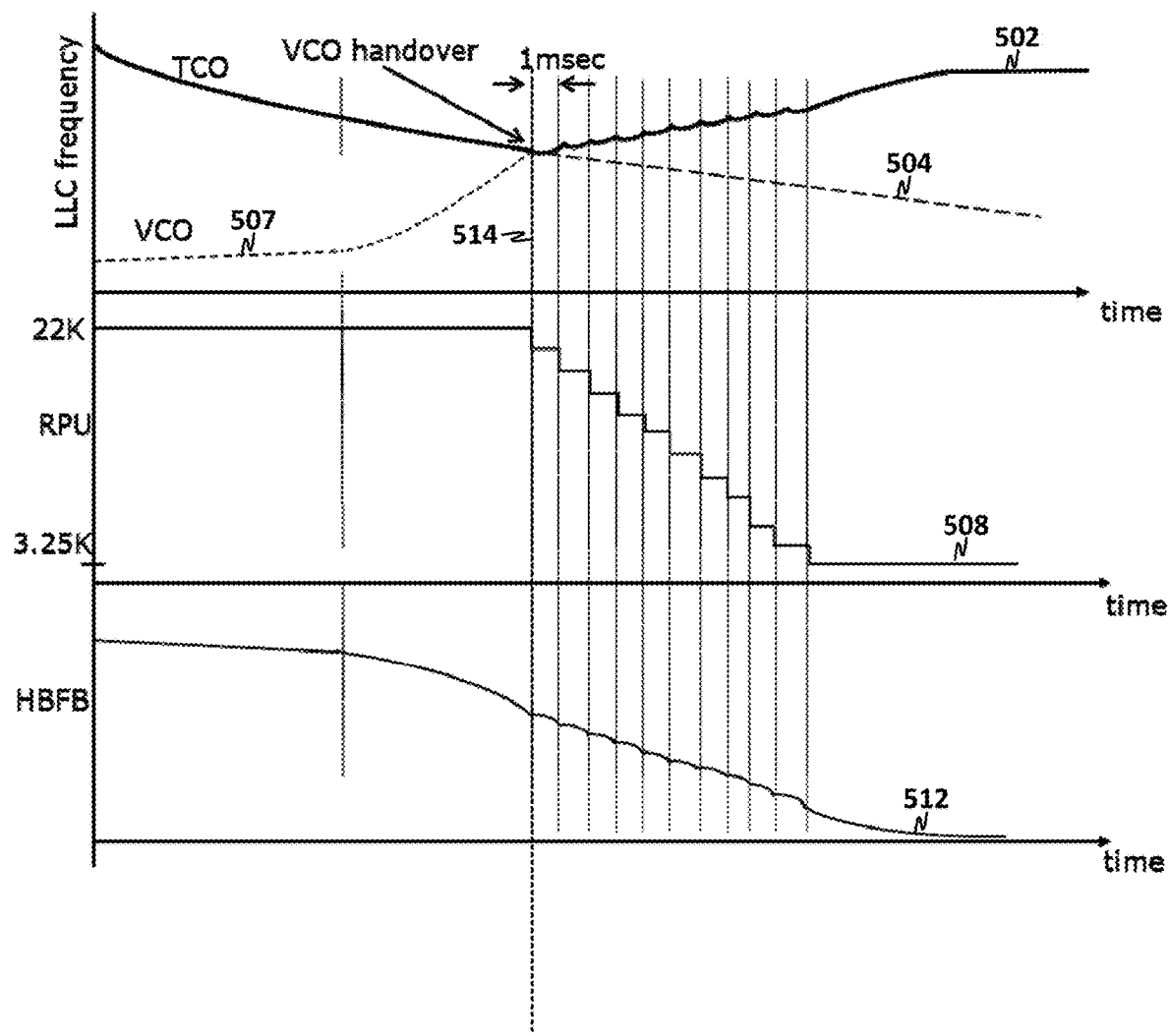
FIG. 5 is a graph illustration of selectively setting a pull-up resistance to a selected resistance value of a set of more than three resistance values in accordance with one or more techniques of this disclosure.

FIG. 5 is a graph illustration of selectively setting a pull-up resistance to a selected resistance value of a set of more than three resistance values in accordance with one or more techniques of this disclosure. The abscissa axis (e.g., horizontal) of FIG. 5 represents time and the ordinate axis (e.g., vertical) of FIG. 5 represents oscillation frequency 502, resistance 508 of pull-up resistance 113, and voltage 512 at feedback node 114.

In the example of FIG. 5, resistance module 112 may be adapted to set pull-up resistance 113 to an initial resistance value until voltage-controlled frequency 507 is greater than time-controlled frequency 504. In this example, resistance module 112 may be adapted to set the pull-up resistance 113 to each resistance value of an ordered set of decreasing resistance vales after voltage-controlled frequency 507 has been greater than time-controlled frequency 504. In some examples, each resistance value of the ordered set of decreasing resistance values is less than the initial resistance value. In some examples, resistance module 112 may be adapted to set the pull-up resistance 113, for each resistance value of the ordered set of resistance values, the pull-up resistance to a respective resistance value of the ordered set of resistance values for a predetermined amount of time (e.g., 1 millisecond).

For example, as shown, after TCO to VCO handover at time 514, resistance module 112 may change resistance 508 of pull-up resistance 113 from 22 kilo-ohms to 3.25 kilo-ohms in eleven steps. In some examples, resistance module 112 may control the change of resistance 508 by firmware of resistance module 112 after every 1 millisecond. In this way, system 100 may reduce output voltage overshoot from 5% to 3% compared to systems that use a fixed resistance value for pull-up resistance. Additionally, stepping in resistance changes to pull-up resistance 113 may provide a 2% margin to satisfy output overshoot requirements.

Figure 6:
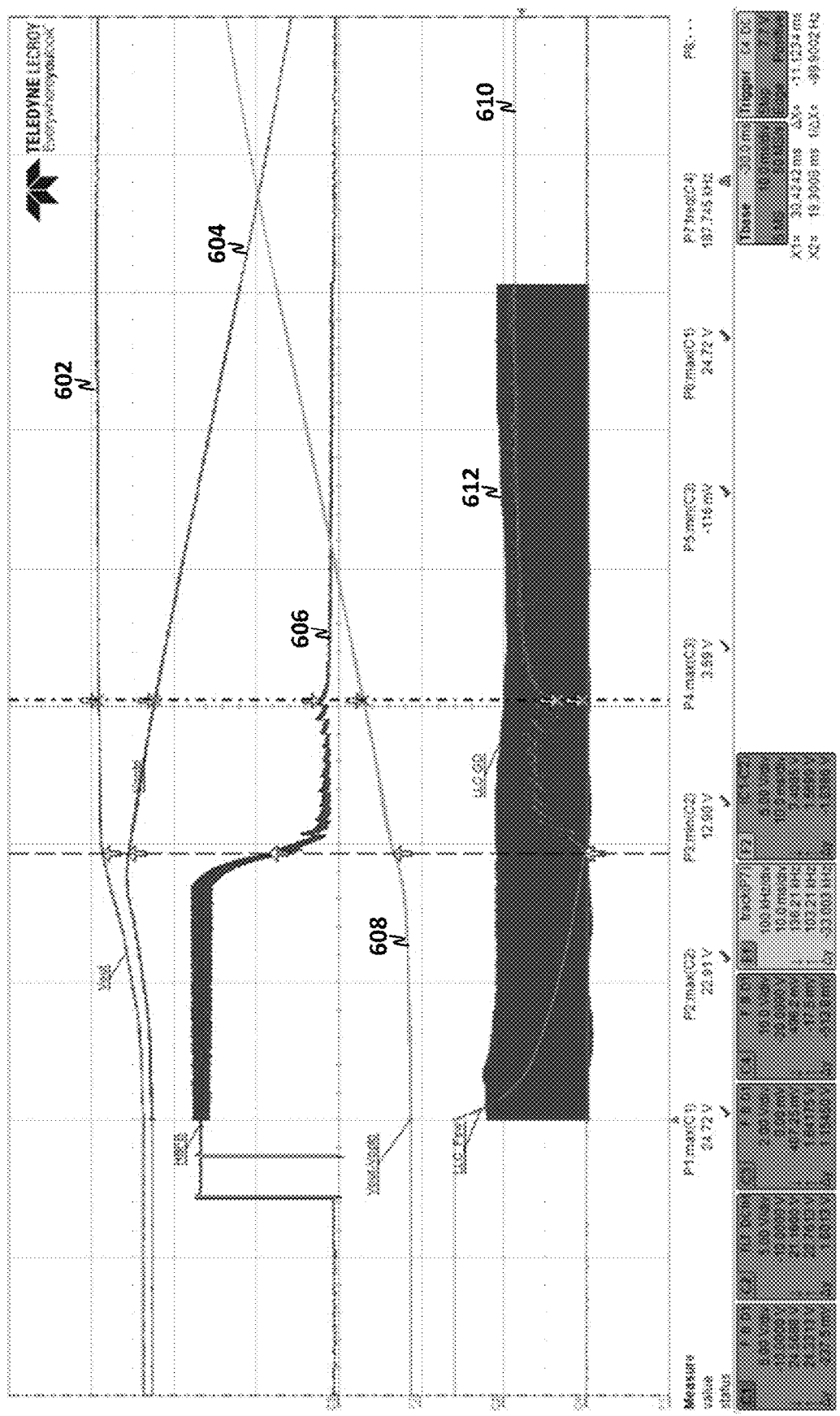
FIG. 6 is a graph illustration of a performance of selectively setting a pull-up resistance in accordance with one or more techniques of this disclosure.

FIG. 6 is a graph illustration of a performance of selectively setting a pull-up resistance in accordance with one or more techniques of this disclosure. The abscissa axis (e.g., horizontal) of FIG. 6 represents time and the ordinate axis (e.g., vertical) of FIG. 6 represents output voltage 602 at secondary side winding 106B, voltage 604 output by optocoupler 116 to feedback node 114, voltage 606 at feedback node 114, current 608 from optocoupler 116 into feedback node 114, frequency 610, and gate drive voltage 612 at switching module 108. In the example of FIG. 6, system 100 may reduce output overshoot at output voltage 602 from 5% to 3% which may provide a 2% margin for a 5% requirement compared to systems that use a static resistance value for pull-up resistance 113.

Figure 7:
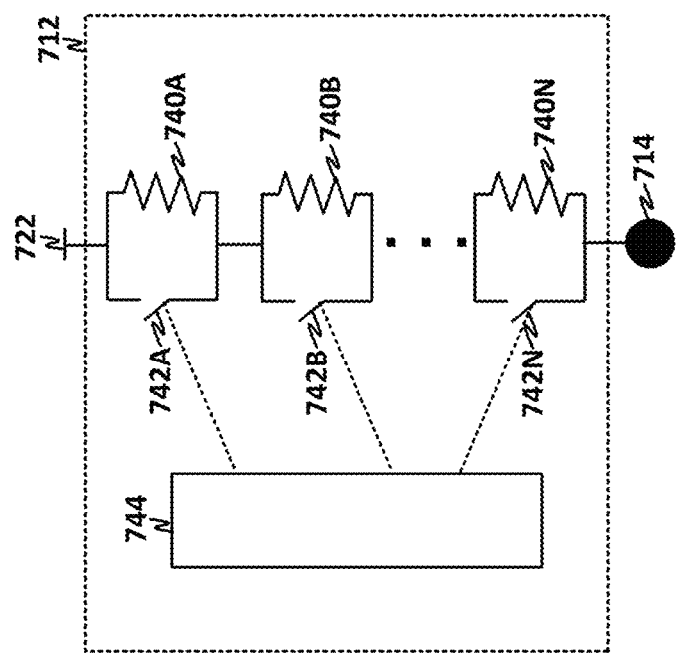
FIG. 7 is a circuit diagram illustrating an example resistance module in accordance with one or more techniques of this disclosure.

FIG. 7 is a circuit diagram illustrating an example resistance module 712 in accordance with one or more techniques of this disclosure. Resistance module 712 may be an example of resistance module 112 of FIG. 1. In the example of FIG. 7, resistance module 712 includes resistors 740A-740N (collectively, resistors 740) arranged in series and bypass switching elements 742A-742N (collectively, bypass switching elements 742). Each one of bypass switching elements 742 may include a switching element.

In the example of FIG. 7, each bypass switching element of bypass switching elements 742 includes a first node coupled to a first node of a corresponding resistor of resistors 740, a second node coupled to a second node of the corresponding resistor of resistors 740, and a control node. For example, bypass switching element 742A includes a first node coupled to a first node of resistor 740A, a second node coupled to a second node of resistor 740A, and a control node.

Resistance driving circuitry 744 selectively generates, for each respective bypass switching element of bypass switching elements 742, a control signal at the control node of the respective bypass switching element to cause the respective bypass switching element to establish a channel between the first node of the respective bypass switching element and the second node of the respective bypass switching element to bypass the corresponding resistor of resistors 740 to set the pull-up resistance between feedback node 714 and the pull-up voltage supply 722. For example, resistance driving circuitry 744 may generate a control signal at a control node of bypass switching element 742A to cause switching element 742A to establish a channel between the first node of bypass switching element 742A and the second node of bypass switching element 742A to bypass resistor 740A to set the pull-up resistance between feedback node 714 and the pull-up voltage supply 722.

Figure 8:
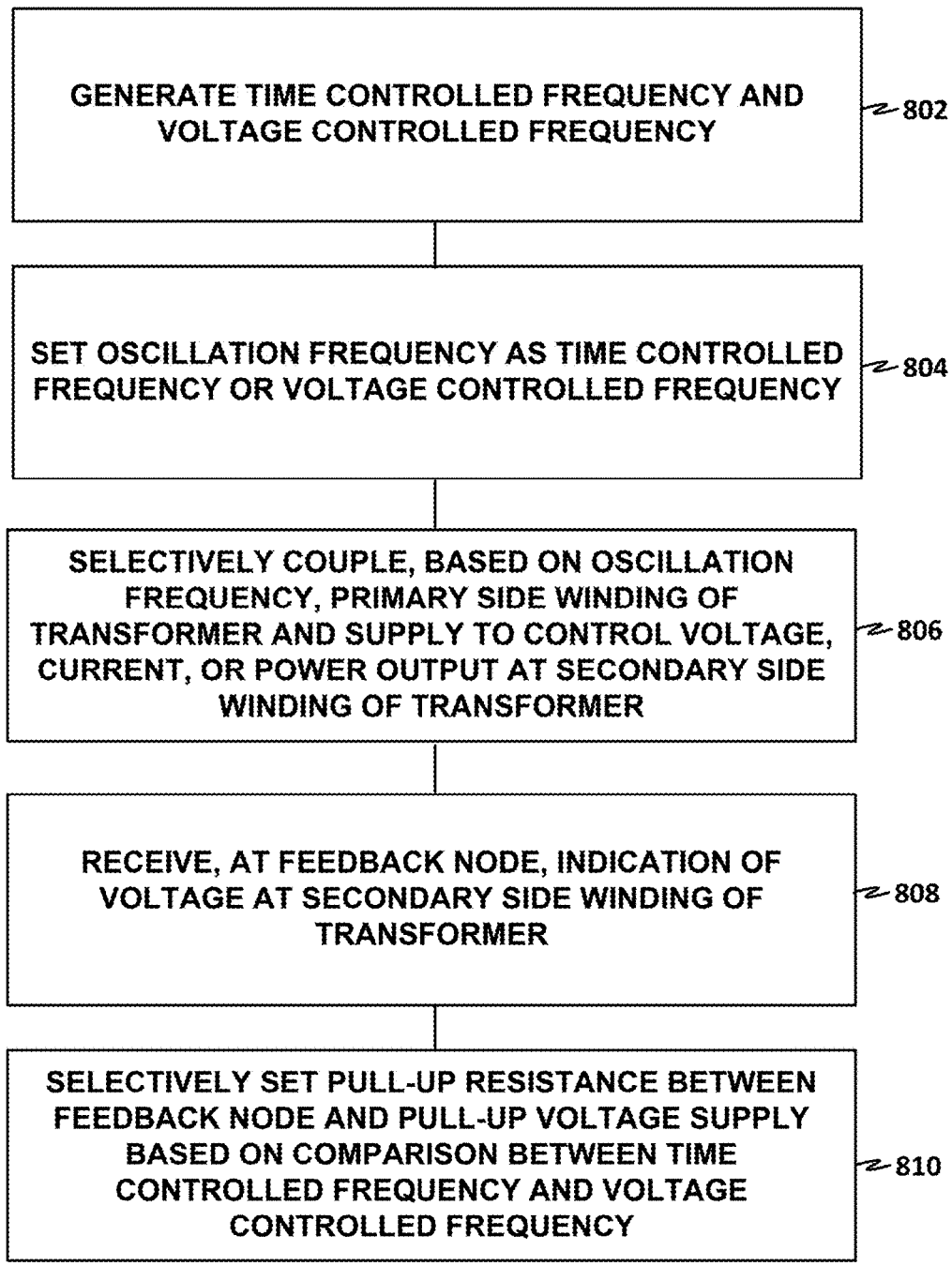
FIG. 8 is a flow diagram for a method for controlling a switching mode power supply in accordance with one or more techniques of this disclosure.

FIG. 8 is a flow diagram for a method for controlling a switching mode power supply in accordance with one or more techniques of this disclosure. FIG. 8 is described in the context of FIGS. 1-7 for exemplary purposes only. In operation, regulation module 110 generates a time-controlled frequency and a voltage-controlled frequency (802). Regulation module 110 sets the oscillation frequency as the time-controlled frequency or the voltage-controlled frequency (804). Switching module 108 selectively couples, based on the oscillation frequency, primary side winding 106A of transformer 106 and supply 102 to control a voltage, current, or power output at secondary side winding 106B of transformer 106 (806). Resistance module 112 receives, at feedback node 114, an indication of a voltage at secondary side winding 106B of transformer 106 (808). Resistance module 112 selectively sets pull-up resistance 113 between feedback node 114 and pull-up voltage supply 122 based on comparison between the time-controlled frequency and the voltage-controlled frequency (810).

While a device has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The techniques of this disclosure may be implemented in a device or article of manufacture comprising a computer-readable storage medium. The term "processing circuitry," as used herein may refer to any of the foregoing structure or any other structure suitable for processing program code and/or data or otherwise implementing the techniques described herein. Elements of system 100 may be implemented in any of a variety of types of solid state circuit elements, such as CPUs, CPU cores, GPUs, digital signal processors (DSPs), application-specific integrated circuits (ASICs), a mixed-signal integrated circuits, field programmable gate arrays (FPGAs), microcontrollers, programmable logic controllers (PLCs), programmable logic device (PLDs), complex PLDs (CPLDs), a system on a chip (SoC), any subsection of any of the above, an interconnected or distributed combination of any of the above, or any other integrated or discrete logic circuitry, or any other type of component or one or more components capable of being configured in accordance with any of the examples disclosed herein. Processing circuitry may also include analog components arranged in a mixed-signal IC.

System 100 may include memory. One or more memory devices of the memory may include any volatile or non-volatile media, such as a RAM, ROM, non-volatile RAM (NVRAM), electrically erasable programmable ROM (EEPROM), flash memory, and the like. One or more memory devices of the memory may store computer readable instructions that, when executed by the processing circuitry, cause the processing circuitry to implement the techniques attributed herein to the processing circuitry.

Elements system 100 may be programmed with various forms of software. The processing circuitry may be implemented at least in part as, or include, one or more executable applications, application modules, libraries, classes, methods, objects, routines, subroutines, firmware, and/or embedded code, for example. The processing circuitry may be configured to receive voltage signals, determine switching frequencies, and deliver control signals.

The techniques of this disclosure may be implemented in a wide variety of computing devices. Any components, modules or units have been described to emphasize functional aspects and does not necessarily require realization by different hardware units. The techniques described herein may be implemented in hardware, software, firmware, or any combination thereof. Any features described as modules, units or components may be implemented together in an integrated logic device or separately as discrete but interoperable logic devices. In some cases, various features may be implemented as an integrated circuit device, such as an integrated circuit chip or chipset.

The following examples may illustrate one or more aspects of the disclosure.

Example 1

A device for controlling a switching mode power supply, the device comprising: a regulation module adapted to cause a switching module to selectively couple, based on an oscillation frequency, a primary side winding of a transformer and a supply to control a voltage, current, or power output at a secondary side winding of the transformer; a feedback node adapted to receive an indication of a voltage at the secondary side winding of the transformer; and a resistance module adapted to selectively set a pull-up resistance between the feedback node and a pull-up voltage supply based on a comparison between a time-controlled frequency and a voltage-controlled frequency that is generated based on a voltage at the feedback node, wherein the regulation module is adapted to set the oscillation frequency as the time-controlled frequency or the voltage-controlled frequency.

Example 2

The device of example 1, wherein, to selectively set the pull-up resistance, the resistance module is adapted to: set the pull-up resistance to a first resistance value until the voltage-controlled frequency is greater than the time-controlled frequency; and set the pull-up resistance to a second resistance value that is less than the first resistance value after the voltage-controlled frequency has been greater than the time-controlled frequency.

Example 3

The device of any combination of examples 1-2, wherein, to selectively set the pull-up resistance, the resistance module is adapted to: set the pull-up resistance to an initial resistance value until the voltage-controlled frequency is greater than the time-controlled frequency; and set the pull-up resistance to each resistance value of an ordered set of decreasing resistance vales after the voltage-controlled frequency has been greater than the time-controlled frequency, wherein each resistance value of the ordered set of decreasing resistance values is less than the initial resistance value.

Example 4

The device of any combination of examples 1-3, wherein, to selectively set the pull-up resistance, the resistance module is adapted to: set, for each resistance value of the ordered set of resistance values, the pull-up resistance to a respective resistance value of the ordered set of resistance values for a predetermined amount of time.

Example 5

The device of any combination of examples 1-4, comprising: a time-controlled oscillation module adapted to generate the time-controlled frequency using an ordered list of decreasing frequencies.

Example 6

The device of any combination of examples 1-5, wherein the regulation module is adapted to set the oscillation frequency as the time-controlled frequency until the voltage-controlled frequency is greater than the time-controlled frequency and set the oscillation frequency as the voltage-controlled frequency after the voltage-controlled frequency has been greater than the time-controlled frequency.

Example 7

The device of any combination of examples 1-6, comprising a time-controlled oscillation module adapted to: generate the time-controlled frequency using an ordered list of decreasing frequencies until the voltage-controlled frequency is greater than the time-controlled frequency; and generate the time-controlled frequency using an ordered list of increasing frequencies after the voltage-controlled frequency has been greater than the time-controlled frequency.

Example 8

The device of any combination of examples 1-7, wherein the regulation module is adapted to: set the oscillation frequency as the time-controlled frequency until the time-controlled oscillation module outputs the time-controlled frequency using the ordered list of increasing frequencies and the voltage-controlled frequency is greater than the time-controlled frequency; and set the oscillation frequency as the voltage-controlled frequency after the time-controlled oscillation module outputs the time-controlled frequency using the ordered list of increasing frequencies and after the voltage-controlled frequency has been greater than the time-controlled frequency.

Example 9

The device of any combination of examples 1-8, comprising: an optocoupler adapted to generate the indication of the voltage at the secondary side winding at the feedback node; and a voltage-controlled oscillation module adapted to generate the voltage-controlled frequency based on the indication of the voltage at the secondary side winding.

Example 10

The device of any combination of examples 1-9, wherein the resistance module comprises: a plurality of resistors arranged in series; a plurality of bypass switching elements, each bypass switching element of the plurality of bypass switching elements comprising a first node coupled to a first node of a corresponding resistor of the plurality of resistors, a second node coupled to a second node of the corresponding resistor, and a control node; and resistance driving circuitry adapted to selectively generate, for each respective bypass switching element of the plurality of bypass switching elements, a control signal at the control node of the respective bypass switching element to cause the respective bypass switching element to establish a channel between the first node of the respective bypass switching element and the second node of the respective bypass switching element to bypass the corresponding resistor to set the pull-up resistance between the feedback node and the pull-up voltage supply; and wherein the switching module comprises: a high side switching element comprising a first node coupled to a positive terminal of the supply, a second node coupled to the primary side winding of the transformer, and a control node; a low side switching element comprising a first node coupled to the primary side winding of the transformer, a second node coupled to a negative terminal of the supply, and a control node; and switch driving circuitry adapted to: selectively generate, based on the oscillation frequency, a first control signal at the high side switching element to cause the high side switching element to establish a first channel between the first node of the high side switching element and the second node of high side switching element to couple the positive terminal of the supply to the primary side winding of the transformer; and selectively generate, based on the oscillation frequency, a second control signal at the low side switching element to cause the low side switching element to establish a second channel between the first node of the low side switching element and the second node of the low side switching element to couple the negative terminal of the supply to the primary side winding of the transformer.

Example 11

A method for controlling a switching mode power supply, the method comprising: causing, by processing circuitry, a switching module to selectively couple, based on an oscillation frequency, a primary side winding of a transformer and a supply to control a voltage, current, or power output at a secondary side winding of the transformer; receiving, by the processing circuitry, at a feedback node, an indication of a voltage at the secondary side winding of the transformer; and selectively setting, by the processing circuitry, a pull-up resistance between the feedback node and a pull-up voltage supply based on a comparison between a time-controlled frequency and a voltage-controlled frequency that is generated based on a voltage at the feedback node, wherein causing the switching module to selectively couple the primary side winding comprises setting the oscillation frequency as the time-controlled frequency or the voltage-controlled frequency.

Example 12

The method of example 11, wherein selectively setting the pull-up resistance comprises: setting the pull-up resistance to a first resistance value until the voltage-controlled frequency is greater than the time-controlled frequency; and setting the pull-up resistance to a second resistance value that is less than the first resistance value after the voltage-controlled frequency has been greater than the time-controlled frequency.

Example 13

The method of any combination of examples 11-12, wherein selectively setting the pull-up resistance comprises: setting the pull-up resistance to an initial resistance value until the voltage-controlled frequency is greater than the time-controlled frequency; and setting the pull-up resistance to each resistance value of an ordered set of decreasing resistance vales after the voltage-controlled frequency has been greater than the time-controlled frequency, wherein each resistance value of the ordered set of decreasing resistance values is less than the initial resistance value.

Example 14

The method of any combination of examples 11-13, wherein selectively setting the pull-up resistance comprises: setting, for each resistance value of the ordered set of resistance values, the pull-up resistance to a respective resistance value of the ordered set of resistance values for a predetermined amount of time.

Example 15

The method of any combination of examples 11-14, comprising: generating, by the processing circuitry, the time-controlled frequency using an ordered list of decreasing frequencies.

Example 16

The method of any combination of examples 11-15, comprising: setting, by the processing circuitry, the oscillation frequency as the time-controlled frequency until the voltage-controlled frequency is greater than the time-controlled frequency; and setting, by the processing circuitry, the oscillation frequency as the voltage-controlled frequency after the voltage-controlled frequency has been greater than the time-controlled frequency.

Example 17

The method of any combination of examples 11-16, comprising: generating, by the processing circuitry, the time-controlled frequency using an ordered list of decreasing frequencies until the voltage-controlled frequency is greater than the time-controlled frequency; and generating, by the processing circuitry, the time-controlled frequency using an ordered list of increasing frequencies after the voltage-controlled frequency has been greater than the time-controlled frequency.

Example 18

The method of any combination of examples 11-17, wherein causing the switching module to selectively couple the primary side winding comprises: setting the oscillation frequency as the time-controlled frequency until the time-controlled oscillation module outputs the time-controlled frequency using the ordered list of increasing frequencies and the voltage-controlled frequency is greater than the time-controlled frequency; and setting the oscillation frequency as the voltage-controlled frequency after the time-controlled oscillation module outputs the time-controlled frequency using the ordered list of increasing frequencies and after the voltage-controlled frequency has been greater than the time-controlled frequency.

Example 19

The method of any combination of examples 11-18, comprising: generating, with an optocoupler, at the feedback node, the indication of the voltage at the secondary side winding at the feedback node; and generating, by the processing circuitry, the voltage-controlled frequency based on the indication of the voltage at the secondary side winding.

Example 20

A system for controlling a switching mode power supply, the device comprising: a supply; a switching module; a transformer comprising at least a primary side winding and a secondary side winding; a regulation module adapted to cause the switching module to selectively couple, based on an oscillation frequency, the primary side winding and the supply to control a voltage, current, or power output at the secondary side winding; a feedback node adapted to receive an indication of a voltage at the secondary side winding; and a resistance module adapted to selectively set a pull-up resistance between the feedback node and a pull-up voltage supply based on a comparison between a time-controlled frequency and a voltage-controlled frequency that is generated based on a voltage at the feedback node, wherein the regulation module is adapted to set the oscillation frequency as the time-controlled frequency or the voltage-controlled frequency.

Various aspects have been described in this disclosure. These and other aspects are within the scope of the following claims.

The invention claimed is:

1. A device for controlling a switching mode power supply, the device comprising:
a regulation module adapted to cause a switching module to selectively couple, based on an oscillation frequency, a primary side winding of a transformer and a supply to control a voltage, current, or power output at a secondary side winding of the transformer;
a feedback node adapted to receive an indication of a voltage at the secondary side winding of the transformer; and
a resistance module adapted to selectively set a pull-up resistance between the feedback node and a pull-up voltage supply based on a comparison between a time-controlled frequency and a voltage-controlled frequency that is generated based on a voltage at the feedback node, wherein the regulation module is adapted to set the oscillation frequency as the time-controlled frequency or the voltage-controlled frequency.

2. The device of claim 1, wherein, to selectively set the pull-up resistance, the resistance module is adapted to:
set the pull-up resistance to a first resistance value until the voltage-controlled frequency is greater than the time-controlled frequency; and
set the pull-up resistance to a second resistance value that is less than the first resistance value after the voltage-controlled frequency has been greater than the time-controlled frequency.

3. The device of claim 1, wherein, to selectively set the pull-up resistance, the resistance module is adapted to:
set the pull-up resistance to an initial resistance value until the voltage-controlled frequency is greater than the time-controlled frequency; and
set the pull-up resistance to each resistance value of an ordered set of decreasing resistance values after the voltage-controlled frequency has been greater than the time-controlled frequency, wherein each resistance value of the ordered set of decreasing resistance values is less than the initial resistance value.

4. The device of claim 3, wherein, to selectively set the pull-up resistance, the resistance module is adapted to:
set, for each resistance value of the ordered set of resistance values, the pull-up resistance to a respective resistance value of the ordered set of resistance values for a predetermined amount of time.

5. The device of claim 1, comprising:
a time-controlled oscillation module adapted to generate the time-controlled frequency using an ordered list of decreasing frequencies.

6. The device of claim 1, wherein the regulation module is adapted to set the oscillation frequency as the time-controlled frequency until the voltage-controlled frequency is greater than the time-controlled frequency and set the oscillation frequency as the voltage-controlled frequency after the voltage-controlled frequency has been greater than the time-controlled frequency.

7. The device of claim 1, further comprising a time-controlled oscillation module adapted to:
generate the time-controlled frequency using an ordered list of decreasing frequencies until the voltage-controlled frequency is greater than the time-controlled frequency; and
generate the time-controlled frequency using an ordered list of increasing frequencies after the voltage-controlled frequency has been greater than the time-controlled frequency.

8. The device of claim 7, wherein the regulation module is adapted to:
set the oscillation frequency as the time-controlled frequency until the time-controlled oscillation module outputs the time-controlled frequency using the ordered list of increasing frequencies and the voltage-controlled frequency is greater than the time-controlled frequency; and
set the oscillation frequency as the voltage-controlled frequency after the time-controlled oscillation module outputs the time-controlled frequency using the ordered list of increasing frequencies and after the voltage-controlled frequency has been greater than the time-controlled frequency.

9. The device of claim 1, comprising:
an optocoupler adapted to generate the indication of the voltage at the secondary side winding at the feedback node; and
a voltage-controlled oscillation module adapted to generate the voltage-controlled frequency based on the indication of the voltage at the secondary side winding.

10. The device of claim 1,
wherein the resistance module comprises:
a plurality of resistors arranged in series;
a plurality of bypass switching elements, each bypass switching element of the plurality of bypass switching elements comprising a first node coupled to a first node of a corresponding resistor of the plurality of resistors, a second node coupled to a second node of the corresponding resistor, and a control node; and
resistance driving circuitry adapted to selectively generate, for each respective bypass switching element of the plurality of bypass switching elements, a control signal at the control node of the respective bypass switching element to cause the respective bypass switching element to establish a channel between the first node of the respective bypass switching element and the second node of the respective bypass switching element to bypass the corresponding resistor to set the pull-up resistance between the feedback node and the pull-up voltage supply; and
wherein the switching module comprises:
a high side switching element comprising a first node coupled to a positive terminal of the supply, a second node coupled to the primary side winding of the transformer, and a control node;
a low side switching element comprising a first node coupled to the primary side winding of the transformer, a second node coupled to a negative terminal of the supply, and a control node; and
switch driving circuitry adapted to:
selectively generate, based on the oscillation frequency, a first control signal at the high side switching element to cause the high side switching element to establish a first channel between the first node of the high side switching element and the second node of the high side switching element to couple the positive terminal of the supply to the primary side winding of the transformer; and
selectively generate, based on the oscillation frequency, a second control signal at the low side switching element to cause the low side switching element to establish a second channel between the first node of the low side switching element and the second node of the low side switching element to couple the negative terminal of the supply to the primary side winding of the transformer.

11. A method for controlling a switching mode power supply, the method comprising:
- causing, by processing circuitry, a switching module to selectively couple, based on an oscillation frequency, a primary side winding of a transformer and a supply to control a voltage, current, or power output at a secondary side winding of the transformer;
- receiving, by the processing circuitry, at a feedback node, an indication of a voltage at the secondary side winding of the transformer; and
- selectively setting, by the processing circuitry, a pull-up resistance between the feedback node and a pull-up voltage supply based on a comparison between a time-controlled frequency and a voltage-controlled frequency that is generated based on a voltage at the feedback node, wherein causing the switching module to selectively couple the primary side winding comprises setting the oscillation frequency as the time-controlled frequency or the voltage-controlled frequency.

12. The method of claim 11, wherein selectively setting the pull-up resistance comprises:
- setting the pull-up resistance to a first resistance value until the voltage-controlled frequency is greater than the time-controlled frequency; and
- setting the pull-up resistance to a second resistance value that is less than the first resistance value after the voltage-controlled frequency has been greater than the time-controlled frequency.

13. The method of claim 11, wherein selectively setting the pull-up resistance comprises:
- setting the pull-up resistance to an initial resistance value until the voltage-controlled frequency is greater than the time-controlled frequency; and
- setting the pull-up resistance to each resistance value of an ordered set of decreasing resistance values after the voltage-controlled frequency has been greater than the time-controlled frequency, wherein each resistance value of the ordered set of decreasing resistance values is less than the initial resistance value.

14. The method of claim 13, wherein selectively setting the pull-up resistance comprises:
- setting, for each resistance value of the ordered set of resistance values, the pull-up resistance to a respective resistance value of the ordered set of resistance values for a predetermined amount of time.

15. The method of claim 11, comprising:
generating, by the processing circuitry, the time-controlled frequency using an ordered list of decreasing frequencies.

16. The method of claim 11, comprising:
setting, by the processing circuitry, the oscillation frequency as the time-controlled frequency until the voltage-controlled frequency is greater than the time-controlled frequency; and setting, by the processing circuitry, the oscillation frequency as the voltage-controlled frequency after the voltage-controlled frequency has been greater than the time-controlled frequency.

17. The method of claim 11, comprising:
- generating, by the processing circuitry, the time-controlled frequency using an ordered list of decreasing frequencies until the voltage-controlled frequency is greater than the time-controlled frequency; and
- generating, by the processing circuitry, the time-controlled frequency using an ordered list of increasing frequencies after the voltage-controlled frequency has been greater than the time-controlled frequency.

18. The method of claim 17, wherein causing the switching module to selectively couple the primary side winding comprises:
- setting the oscillation frequency as the time-controlled frequency until a time-controlled oscillation module outputs the time-controlled frequency using the ordered list of increasing frequencies and the voltage-controlled frequency is greater than the time-controlled frequency; and
- setting the oscillation frequency as the voltage-controlled frequency after the time-controlled oscillation module outputs the time-controlled frequency using the ordered list of increasing frequencies and after the voltage-controlled frequency has been greater than the time-controlled frequency.

19. The method of claim 11, comprising:
- generating, with an optocoupler, at the feedback node, the indication of the voltage at the secondary side winding at the feedback node; and
- generating, by the processing circuitry, the voltage-controlled frequency based on the indication of the voltage at the secondary side winding.

20. A system for controlling a switching mode power supply, the device comprising:
- a supply;
- a switching module;
- a transformer comprising at least a primary side winding and a secondary side winding;
- a regulation module adapted to cause the switching module to selectively couple, based on an oscillation frequency, the primary side winding and the supply to control a voltage, current, or power output at the secondary side winding;
- a feedback node adapted to receive an indication of a voltage at the secondary side winding; and
- a resistance module adapted to selectively set a pull-up resistance between the feedback node and a pull-up voltage supply based on a comparison between a time-controlled frequency and a voltage-controlled frequency that is generated based on a voltage at the feedback node, wherein the regulation module is adapted to set the oscillation frequency as the time-controlled frequency or the voltage-controlled frequency.

* * * * *